United States Patent [19]

Miller et al.

[11] Patent Number: 5,190,206

[45] Date of Patent: Mar. 2, 1993

[54] ULTRASONIC WIRE BONDING TOOL AND METHOD FOR SELF-THREADING SAME

[75] Inventors: Charles F. Miller, Anaheim Hills; Kenneth L. Biggs, Orange, both of Calif.

[73] Assignee: West Bond Inc., Anaheim, Calif.

[21] Appl. No.: 911,190

[22] Filed: Jul. 9, 1992

[51] Int. Cl.$^5$ .................... H01L 21/60; H01L 21/607
[52] U.S. Cl. .................................. 228/102; 228/179; 228/4.5; 228/7
[58] Field of Search ............... 228/102, 179, 110, 111, 228/1.1, 4.5, 7; 219/56.21, 56.22

[56] References Cited

U.S. PATENT DOCUMENTS

| | | | |
|---|---|---|---|
| 4,619,397 | 10/1986 | Urban | 228/4.5 |
| 4,645,118 | 2/1987 | Biggs et al. | 228/4.5 |
| 4,771,930 | 9/1988 | Gillotti et al. | 228/102 |
| 4,976,392 | 12/1990 | Smith et al. | 228/102 |
| 5,018,658 | 5/1991 | Farassat | 228/4.5 |

Primary Examiner—Samuel M. Heinrich
Attorney, Agent, or Firm—William L. Chapin

[57] ABSTRACT

An improved tool for ultrasonic wire bonding, and a novel method by which the tool may be semi-automatically threaded with bonding wire are disclosed. The overall exterior shape of the tool is that of an elongated rectangular cross-section bar having at the lower end thereof a tapered, smaller cross-section tip. The tip includes a flattened front toe section for applying ultrasonic energy to wire and a bonding pad, and an upawardly angled oblique lower face rearward of the toe section. A wire guide hole through the tip that has a longitudinal axis that slopes upward at a steeper angle than the oblique lower face has an exit opening in the lower oblique face, just rearward of the front toe section. The guide hole has an enlarged opening in the rear face of the tip. An elongated straight shallow groove formed in a side wall of the tip extends obliquely downwards from the rear face to front face of the tip. To semi-automatically thread bonding wire into the guide hole of the tool, a length of bonding wire is laid in the groove and severed at a ledge formed by the intersection of the groove with the front face of the tool. Microprocessor controlled clamp means are then used to retract the wire from the tool to a pre-set Retracted position. The wire end is then moved under microprocessor control forward towards the tool to a pre-set Home position, inserting the wire into the guide hole entrance.

18 Claims, 3 Drawing Sheets

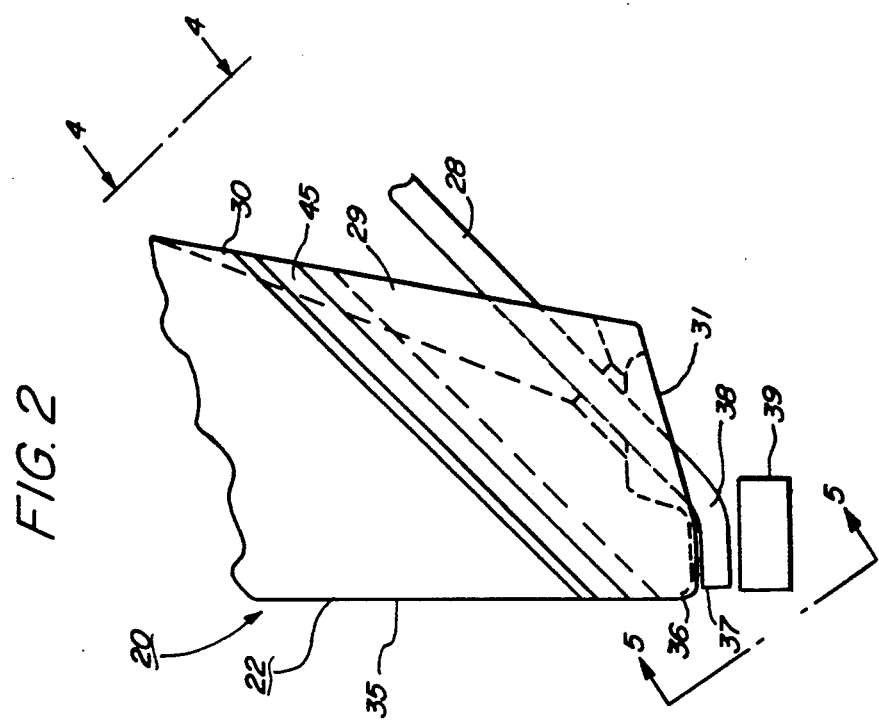
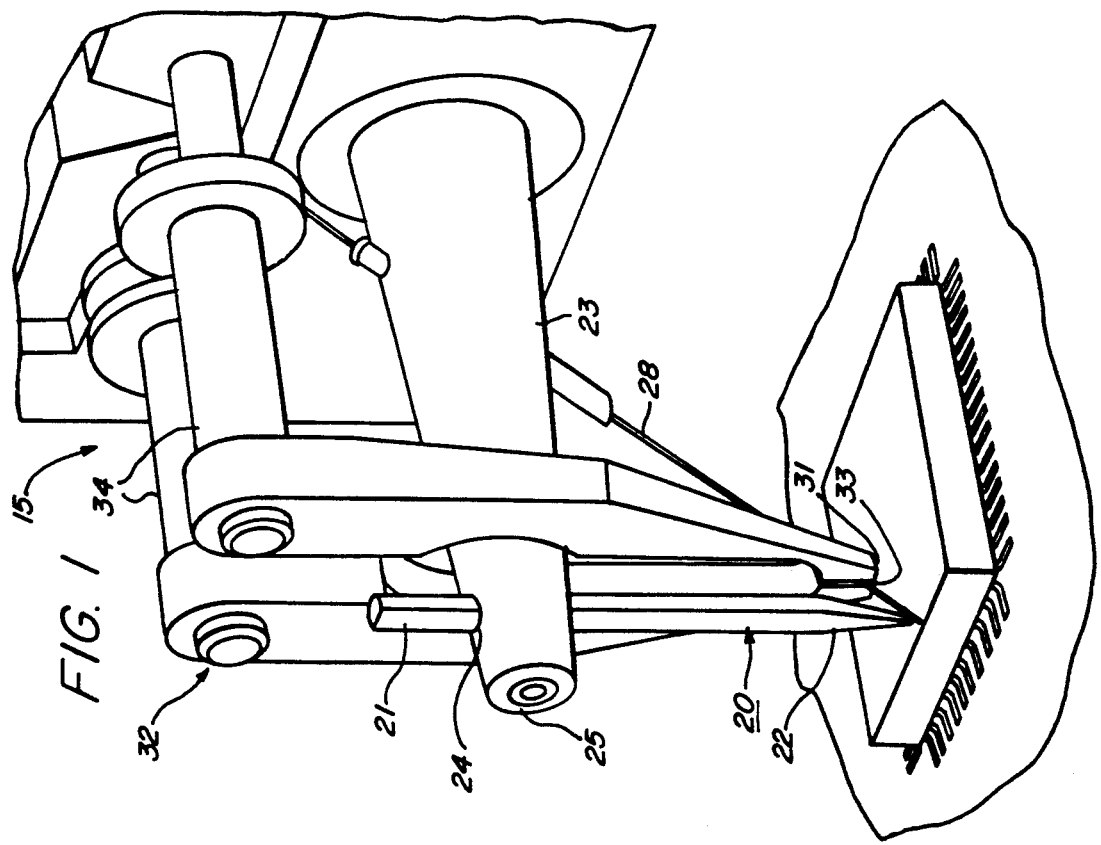

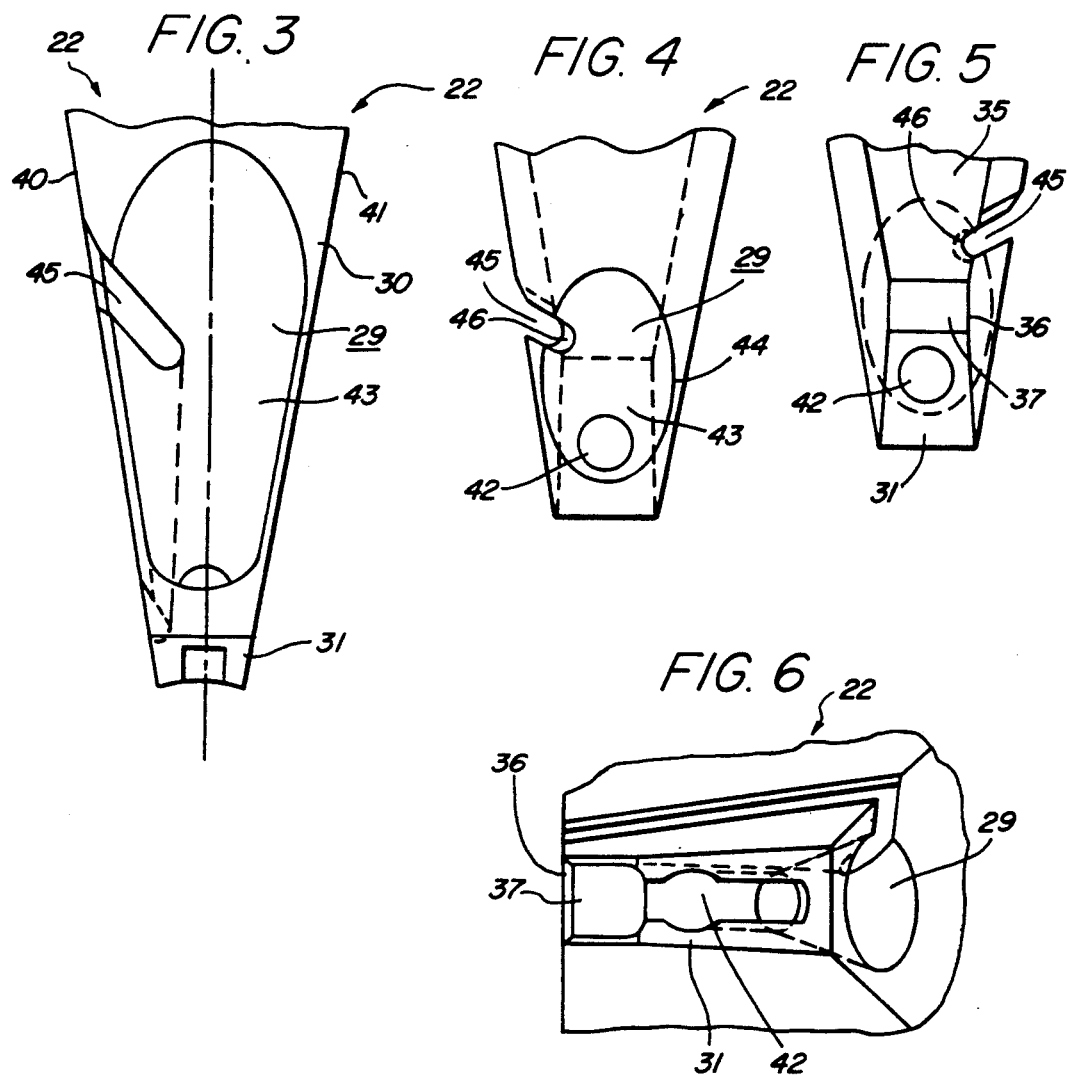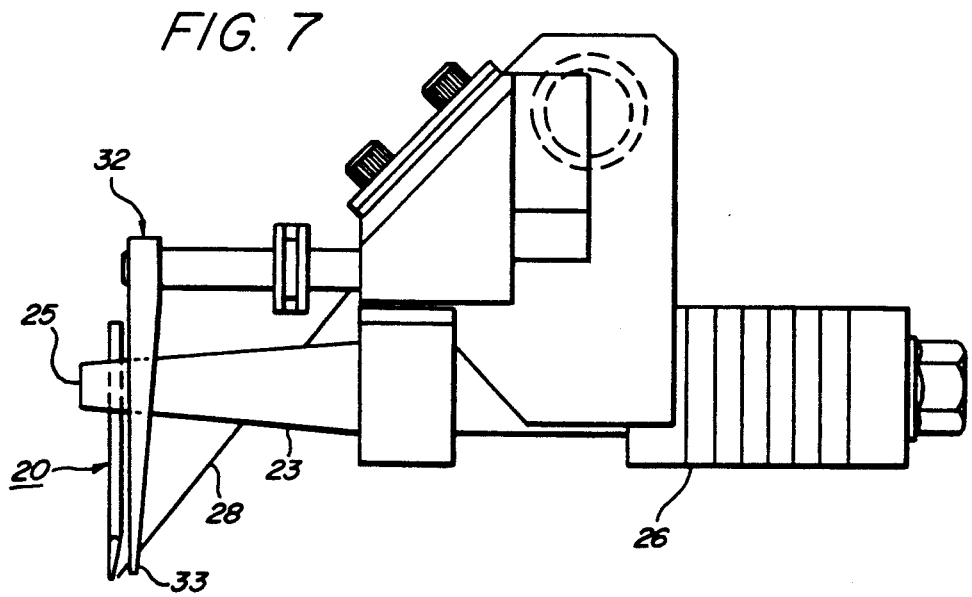

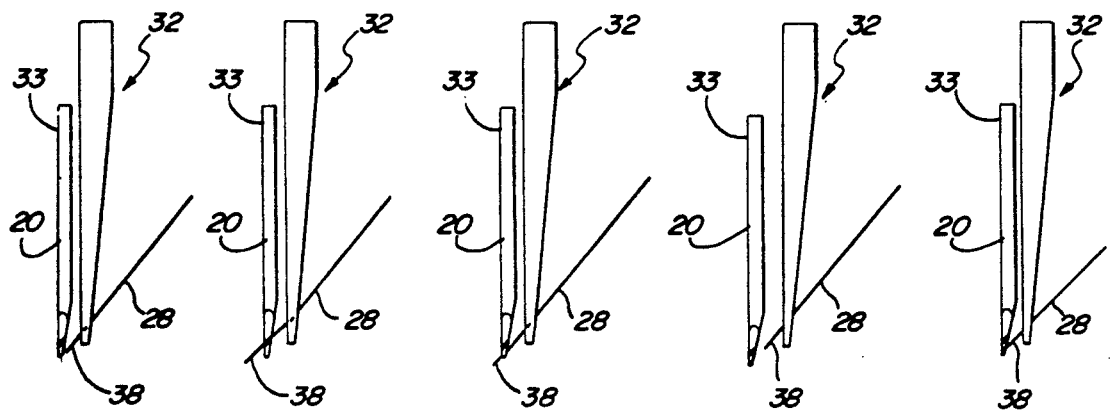
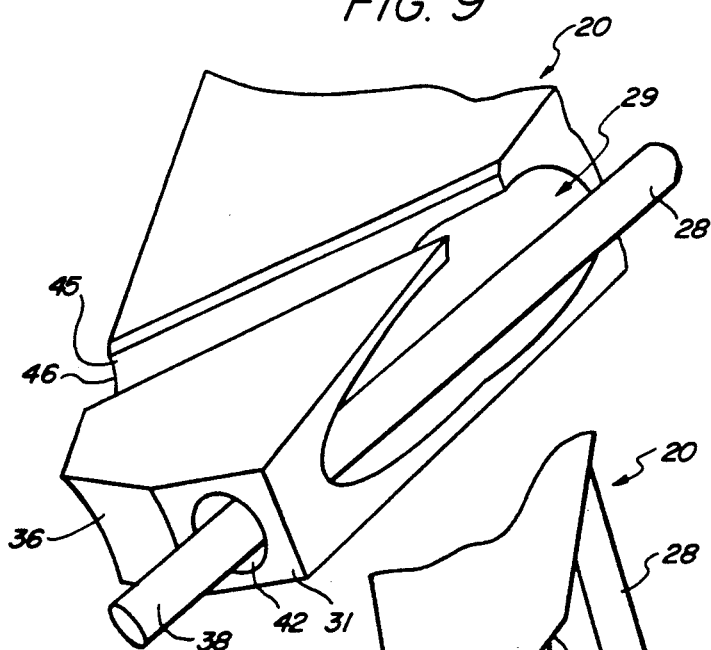
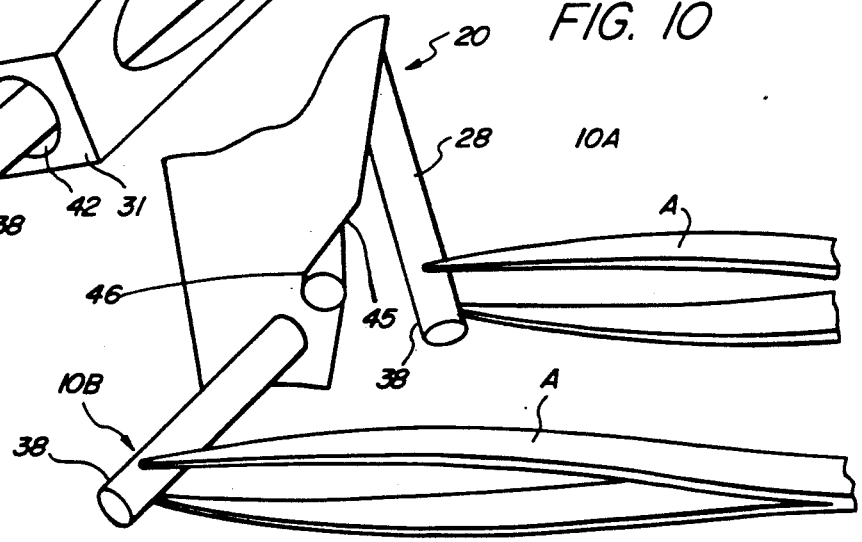

ULTRASONIC WIRE BONDING TOOL AND METHOD FOR SELF-THREADING SAME

BACKGROUND OF THE INVENTION

A. Field of the Invention

The present invention relates to apparatus used for ultrasonically bonding electrically conductive wires to miniature electronic circuit elements, such as integrated and hybrid micro-circuit chips. More particularly, the invention relates to an improved bonding tool for ultrasonically bonding wires to conductive pads of micro-circuits, in which fine bonding wire may be semi-automatically threaded into the tool.

B. Description of Background Art

Miniature electronic circuits, or micro-circuits are used in vast quantities, in a wide variety of consumer, commercial, industrial and military apparatus. The majority of such micro-circuits are of a type referred to as integrated circuits. Integrated circuits contain a large number of active circuit elements such as transistors, and passive elements such as resistors and capacitors. In semiconductor integrated circuits, conductive paths between circuit elements on a semiconductor substrate are formed by selectively etching the substrate. In hybrid micro-circuits, circuit elements mounted on a ceramic substrate are usually interconnected by conductive ink paths on the substrate.

The functional portions of integrated circuits are typically in the form of very small, rectangular-shaped chips, ranging in size from 0.025 inch to 0.200 inch or more on a side. Input connections to integrated circuit chips are often made by bonding a very fine wire to conductive pads on the chips, the other end of each wire being bonded to a conductive terminal that is sufficiently large and robust to be inserted into a printed circuit board and soldered to conductors on the board.

Typically, bonding wire used to interconnect the pads of a semiconductor chip to terminals of a package containing the chip are made of aluminum or gold, and have a diameter of about 1 mil (0.001 inch). These wires must be bonded to small, typically rectangular-shaped, integrated circuit pads a few mils wide.

The most common method of interconnecting wires between semiconductor chip pads and external terminals is to form an ultrasonic weld at each end of a conducting wire. To form such bonds, the free end of a length of wire is placed in contact with a pad. Then the tip of an ultrasonic transducer is pressed against the wire, and energized with ultrasonic energy for a short time interval, welding the wire to the pad. The unbonded length of wire is then moved to other pads, and bonded thereto by the same process. After the last bond in a series of bonds has been thus formed, the wire is severed near the last bond.

Usually, the ultrasonic bonding operations described above are performed manually. In view of the very small size of the micro-circuit pads and bonding wire, it can be appreciated that ultrasonic bonding of connecting wires to integrated circuit pads must be performed by skilled operators viewing a work area with a stereo microscope, using a tool mounted in a bonding machine that permits the tool to be manipulated to precisely controllable positions within the work area.

Typical wire bonding machines used for ultrasonic welding of wires to micro-circuit pads includes an elongated, vertically disposed, force-applying member or "tool." The tool is connected at the upper end thereof to a source of ultrasonic energy, such as a piezoelectric transducer connected to an electrical energy source alternating at an ultrasonic frequency. Usually, the tool is connected to the transducer through a tapered horn structure that matches the acoustic input impedance of the small tool to the output impedance of the larger transducer.

Ultrasonic bonding tools used to bond wires to micro-circuit pads generally have a flat lower working face adapted to press a bonding wire into contact with a pad, while ultrasonic energy is applied through the tool to the wire to form an ultrasonic weld. This working face is usually quite small, typically having a rectangular shape only about a few mils along a side. The working face must be quite small to permit bonding to small micro-circuit pads, without contacting adjacent circuit elements. Typically, this is done while viewing the pad and tool tip in a stereo microscope.

In most wire bonding machines, the bonding tool is so constructed as to facilitate the positioning of bonding wire over a pad, prior to performing the bonding operation. Such bonding tools may include an upwardly angled lower face rearward of the working face, and a generally vertically disposed rear face. An angled bore or guide hole having an entrance aperture in the rear face and an exit aperture in the angled lower face permit bonding wire from a reel mounted upward and rearward of the tool to be paid out through the exit aperture of the angled lower face. Typically, a remotely actuable clamp located rearward of the guide hole entrance and movable with the tool is used to feed bonding wire through the guide hole of the tool.

The clamp used to effect movement of wire through the guide hole of a bonding tool usually consists of a pair of jaws that may be closed to grip the wire, or opened to allow free travel of the wire. Generally, such clamps may be moved toward and away from the guide hole entrance, typically on a line of movement which coincides with the axis of the guide hole. To feed wire through the guide hole, the jaws of the clamp are first opened, and the clamp then moved away from the guide hole. The jaws are then closed to grip the wire, and then moved towards the guide hole, thus feeding wire through the guide hole.

In wire bonding machines of the type just described, the machine is used to move the bonding tool to the proper position to bond wire to a pad, feed wire out through the guide hole exit aperture, move the tool to another pad and form another bond. In this manner, any desired number of pads or other elements of a circuit can be connected together, in a procedure referred to as a "stitch" bonding. After the last bond in a series of bonds has been made, the wire must be severed, to permit making other, unconnected bonds. Oftentimes, the bonding tool itself is utilized to sever the bonding wire.

Now, as described above, the entrance to the bonding wire guide hole is usually located on the rear of the bonding tool. This arrangement permits wire to be paid out in a forward direction, as various circuit pads are moved rearward relative to the front face of the bonding tool, to place the pad under a length of wire beneath the lower working face of the bonding tool. Because of the concealed location of the guide hole entrance, the small size of the entrance, and the small size of the bonding wire, threading bonding wire into the hole is usually a painstaking and often frustrating task. Threading a bonding wire into a guide hole must be performed either by viewing the guide hole entrance and tip of the wire through mirror, or developing a skill to thrust the wire end into an otherwise "blind" hole.

To alleviate the problem of threading a bonding wire into the guide hole of a bonding tool, the present inventors devised improved threading means, disclosed in U.S. Pat. No. 4,645,118, Feb. 24, 1987, Biggs and Miller, Method And Means For Threading Wire Bonding Machines. That patent discloses a semiautomatic method of threading bonding wire into the guide hole of a wire bonding tool. The method employs a bar-shaped structure having a diamond-shaped notch formed in upper front edge of the bar. The end of a length of bonding wire is positioned in the notch, and the bonding tool positioned in line with the wire proximate to the wire end. The coordinates of the bonding tool at this position are stored in memory means operably interconnected with a positioning mechanism used to precisely position the tool tip. The wire feed mechanism of the bonding machine is then actuated to feed wire into the entrance to the guide hole. By recording the several displacements of the tool in the initial threading process, and causing the tool to repeat those displacements, threading the bonding machine with bonding wire is made automatic except for the steps of laying the standing part of the wire in the notch, and severing the wire at the end of the notch. The present invention comprises an improved ultrasonic bonding tool incorporating an automatic threading capability directly into the tool, thus obviating the need for a notched auxiliary structure and numerically controlled machine movements.

OBJECTS OF THE INVENTION

An object of the present invention is to provide an improved ultrasonic tool for wire bonding, and a method by which the tool may be semi-automatically threaded with bonding wire.

Another object of the invention is to provide a novel ultrasonic bonding tool which is adapted to sever a standing portion of bonding wire from a supply of bonding wire, and semiautomatically thread the severed end of the bonding wire into a guide hole provided through the tool.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described in this specification are merely illustrative of the preferred embodiment. Accordingly, we do not intend that the scope of our exclusive rights and privileges in the invention be limited to details of the embodiments described. We do intend that equivalents, adaptations and modifications of the invention reasonably inferable from the description contained herein be included within the scope of the invention as defined by the appended claims.

SUMMARY OF THE INVENTION

Briefly stated, the present invention comprehends an improved tool for ultrasonic wire bonding, and a method by which the tool may be semi-automatically threaded with bonding wire.

The improved semi-automatically threadable ultrasonic bonding tool according to the present invention has a front toe section having a generally flat lower bonding surface, and an angled lower face that slopes upwardly and rearwardly from the toe section. A wire guide hole having a bore axis which slopes upward at a steeper angle than the angled lower face has an exit opening in the angled lower face, just rearward of the front toe section. A conically-shaped tapered entrance section of the guide hole has a larger diameter entrance opening in the rear face of the tool.

An elongated straight groove or notch is formed in a side wall of the bonding tool. The groove extends obliquely downwards from the rear face to the front face of the tool.

To semi-automatically thread bonding wire through the guide tool of the bonding tool according to the present invention, a length of bonding wire is grasped by a tweezer, pulled through an opened pair of clamping jaws rearward of the bonding tool, laid in the groove and draped across the front face of the tool. The clamping jaws are then closed on the wire, the free end of the wire grasped in the jaws of a pair of tweezers, and the wire pulled taut in a rearward direction against the intersection of the groove with the front wall of the tool, until the wire breaks. The clamping jaws of the bonding tool are then closed on the standing part of the wire, and retracted, pulling the free end of the severed wire rearward of the guide hole entrance. In this step, the wire bends back into alignment with the guide hole, owing to the length and orientation of the groove relative to the guide hole bore. The end of the severed wire is then positioned a desired distance rearward of the entrance opening to the guide hole by actuation of the clamping jaws, and that retracted position of the clamp stored in memory means connected to position sensing means coupled to the clamp actuator. The clamp is then used to feed the free end of the wire forward into the entrance hole. This position of the clamp, referred to as the "Home" position is also recorded in the memory means.

After the initialization operation just described, the tool according to the present invention may be automatically threaded by placing a wire in the groove and severing the wire at the front edge wall of the groove. The clamping jaws are then actuated to move the severed end of the wire rearward to the pre-programmed retracted position. Finally, the severed end of the wire is advanced to the pre-programmed Home position, causing the wire to enter the guide hole. In the preferred embodiment, forward and rearward motion of the clamp is incremental or stepwise between two discrete positions. In this arrangement, wire position is sensed by an accumulation of counts from limit sensors responsive to the incremental motion extremes of the clamp. These counts are stored in a microprocessor, which utilizes the counts to remember Home and Retracted positions, and to move the wire to these positions upon operator commands.

BRIEF DESCRIPTION OF THE DRAWINGS

FIG. 1 is a magnified perspective view of part of an ultrasonic wire bonding machine, including a novel automatic-threading bonding tool according to the present invention.

FIG. 2 is a fragmentary right side elevation view of the novel bonding tool of FIG. 1, on a further magnified scale.

FIG. 3 is a rear elevation view of the tool of FIG. 2.

FIG. 4 is an oblique view of the tool of FIG. 2, taken from above and to the rear of the tool, in the direction of the arrows 4—4 in FIG. 2.

FIG. 5 is another oblique view of the tool of FIG. 2, taken from in front of and below the tool, along the direction indicated by arrows 5—5 in FIG. 2.

FIG. 6 is a bottom plan view of the tool of FIG. 2.

FIG. 7 is a side elevation view of that portion of the bonding machine and tool shown in FIG. 1.

FIGS. 8A–8E are fragmentary views of the apparatus of FIG. 7, showing a sequence of steps in which the tool of FIG. 7 may be semi-automatically threaded.

FIG. 9 is a perspective view of the tool of FIG. 7, on a greatly magnified scale, showing a bonding wire threaded through the guide hole of the tool.

FIG. 10 is a front perspective view of the tool of FIG. 9, showing how a bonding wire is laid within a groove in the tool and severed.

DETAILED DESCRIPTION OF THE INVENTION

Referring now to FIGS. 1 through 10, an improved ultrasonic bonding tool 20 according to the present invention is shown, along with part of an ultrasonic wire bonding machine 15, of the type which the tool is intended to be used with. As will be described in detail below, the novel structure of the improved bonding tool 20 affords a capability for semi-automatically threading bonding wire through the tool.

As shown in FIG. 1, the improved self-threading ultrasonic bonding tool 20 according to the present invention has in overall exterior appearance the shape of an elongated cylindrical bar 21 having a generally pyramidally tapered, wedge-shaped tip section 22. Tool 20 is shown in a vertically disposed position, as is customary in most bonding operations. The upper portion of bar 21 of tool 20 is fastened to a frustoconically-shaped transducer horn 23, being held within a vertically disposed bore 24 which passes transversely through the horn, near its smaller diameter, outer end 25.

As may be seen best by referring to FIG. 7, the larger, rear portion of the transducer horn 23 is attached to a piezoelectric force transducer 26. The function of transducer 26 is to convert electrical energy into ultrasonic vibrations which are coupled to tool 20 through horn 25. The purpose of horn 23 is to match the acoustic output impedance of transducer 26 to the acoustic input impedance of tool 20, thus maximizing the efficiency of acoustic power transference from the transducer to the tool.

Referring now to FIGS. 1 and 2, in conjunction with FIG. 7, ultrasonic bonding machine 15 may be seen to include a length of bonding wire 28 which may pay off a supply through a guide hole 29 which extends obliquely from the rear face 30 of tool 20, through the lower diagonal face 31 of the tool. As shown in FIGS. 1 and 7, bonding wire 28 passes between the lower ends of a pair of vertically disposed jaws 33 of a clamp 32. The upper end of each jaw 33 is fastened to the front end of a horizontally disposed drive shaft 34. The rear ends of drive shafts 34 are connected to a rotary actuator mechanism capable of rotating each drive shaft about its longitudinal axis, thereby opening and closing jaws on wire 28, in response to a first electrical command signal.

Bonding machine 15 also includes translation actuator means for translating jaws 33 towards and away from tool 20, in response to a position command signal from a microprocessor.

To feed wire 28 forward through guide hole 29 of tool 20, jaws 23 are opened, translated rearward, closed on the wire, and translated forward, pushing the wire forward through the guide hole. Since, as shown in FIGS. 8C and 8D, the incremental motions of jaws 23 are quite small, the aforementioned sequence must be repeated several times to advance the wire an appreciable distance. In the preferred embodiment, the sequence of incremental motions of clamp 32 required to move wire 28 are controlled by a microprocessor, responsive to an "inching" or feed control switch actuated by an operator.

The novel structure of tool 20 which allows wire 28 to be semi-automatically threaded into guide hole 29 may be best understood by referring to FIGS. 2 through 5.

As shown in FIG. 2, the lower, working end or tip 22 of tool 20 has in side elevation view the overall shape of a five-sided polygon, including an elongated flat vertically disposed front face 35. Tip 22 of tool 20 also has a short, generally rectangular-shaped, horizontally disposed front toe section 36. Toe section 36 has a flat lower wall 37 which is adapted to press a standing part 38 of a bonding wire 28 against a conductive circuit pad 39. Then, when ultrasonic acoustic energy is conducted through tool 20 to toe section 36, sufficient vibrational energy is coupled to standing part 38 and pad 39 to weld the wire to the pad.

As shown in FIG. 2, tip section 22 of tool 20 also has a flat lower oblique face 31 which slopes upward from lower face 37 to join an obliquely disposed, generally flat rear wall 30. As may be seen best by referring to FIG. 3, tool tip section 22 also has generally flat right and left side walls 40 and 41 which taper outwards towards the upper end of the tip section. Thus, tip section 22 has a tapered wedge-shape in rear elevation view (FIG. 3) and front elevation view (FIG. 4).

As shown in FIG. 2, tip section 22 of tool 20 has a bore or guide hole 29 which extends through rear wall 30 and lower oblique wall 31. The longitudinal axis of guide hole 29 is inclined upward with respect to lower wall 37 of the toe section 36, at a larger angle than is lower oblique wall 31. As may be seen best by referring to FIG. 6, lower oblique wall 31 of tool tip section 27 has therethrough an aperture 42 communicating with guide hole 29. Aperture 42 serves as an exit opening for bonding wire 28 in guide hole 29.

As may be seen best by referring to FIGS. 2, 3 and 4, guide hole 29 has an upper rear section 43 that has in end view the shape of a circular cross-section funnel that has been flattened somewhat into an ovoid shape. Funnel-shaped section 43 has an aperture or entrance opening 44 in rear wall 30 of tool tip section 22, of substantially larger diameter than exit opening 42. Entrance opening 44 is of enlarged size to facilitate insertion of bonding wire 28 into guide hole 29, when threading tool 20.

Referring again to FIG. 2, it may be seen that an elongated, straight shallow groove 45 is formed in the right wall 40 of tool tip section 22. Groove 45 intersects both rear wall 30 and front wall 35 of tool tip section 22. Groove 45 extends obliquely upwards from front wall 35 of tool tip section 22, the longitudinal axis of the groove being approximately parallel to the longitudinal axis of guide hole 29.

As may be seen best by referring to FIGS. 4 and 5, groove 45 has a generally semi-circular cross-sectional shape, thus forming a semi-circular ledge 46 at the intersection of the groove with front wall 35 of tool tip section 22.

The novel method of semi-automatically threading bonding wire into tool 20, which is facilitated by its novel structure, will now be described.

Referring now to FIGS. 8-10, and particularly to FIGS. 8 and 9, the first step in semi-automatically threading end 38 of a length of bonding wire 28 into the guide hole 29 of tool 20 includes opening jaws 33 of clamp 32. This is accomplished by operating a clamp switch which remotely energizes an actuator connected to the jaws. Next, as shown in FIG. 8B and FIG. 10A, end 38 of wire 28 is grasped by a pair of tweezers, and pulled gently through open jaws 33 of clamp 32, sufficiently far for the end of the wire to be laid in groove 45.

With wire end 38 held in groove 45 by means of tweezers A, the clamp switch is operated to close jaws 33 on the standing part 38 of the bonding wire. Then, as shown in FIGS. 8C and 10B, tweezers A are used to pull wire end 38 taut down and across ledge 46 of groove 45, severing the wire at its contact point with the ledge.

Referring now to FIG. 8D, after wire end 38 is severed, the actuator mechanism for jaws 33 is energized so as to retract the jaws upward and rearward from tool 20 along the axis of the guide hole, while retaining the wire end gripped between the jaws. This action causes wire end 38 to spring back straight into alignment with the standing portion 38 of the wire, and in line with the axis of guide hole 29. Wire end 38 is moved incrementally rearward of tool 20 by successive clamping, retracting, opening, advancing, clamping and retraction actuations of claim jaws 33. The aforementioned sequence of steps causing reverse motion of wire 38 is controlled by microprocessor signals, responsive to an operator's reverse actuation of an "inching" switch. When wire end 38 has been incremented rearward to a desired position just rearward of entrance aperture 44 of guide hole 29, that "Retracted" position is stored in electronic memory means as the accumulation of transferred counts produced by limit sensors upon each incremental excursion of clamp 32.

Finally, end 38 of wire 28 is advanced towards entrance opening 44 of guide hole 29. This is accomplished by forward actuation sequence of jaws 33 of clamp 32, in which the jaws are opened, retracted, closed and advanced, thus pushing wire end 38 forward into guide hole 29, as shown in FIGS. 8E and 9. The forward actuation sequence is controlled by a microprocessor in response to an operator's forward actuation of the inching switch. The forward position of clamp 29 relative to tool 20 is recorded in electronic memory means as a "Home" position.

Having completed a one-time initialization sequence as described above, tool 20 may be semi-automatically threaded with bonding wire whenever desired. To perform the semi-automatic threading operation, the operator simply lays the end of a length of bonding wire in groove 45, breaks the wire on ledge 46, uses a switch to command the actuator mechanism of clamp 32 to move jaws 33 to the Retracted position, and then activates a switch which causes the actuator mechanism to move clamp 32 to the Home position. Thus, the tool and semi-automatic threading method according to the present invention provides a highly effective means for semi-automatically threading a bonding wire into the guide hole of an ultrasonic bonding tool, without requiring the use of any accessory apparatus.

What is claimed is:

1. An improved tool for ultrasonic wire bonding comprising;
   a. an elongated shaft adapted at a first end thereof to receive and transmit vibrational energy from an acoustic power source,
   b. a tapered tip section joined to the second end of said shaft, said tip section having a front wall, a flat lower front toe section, a lower oblique wall which slopes upward and rearward from said toe section, a rear wall which intersects said lower oblique wall, a guide hole adapted to receive a wire extending obliquely through said rear wall and said lower oblique wall, said guide hole having an enlarged rear entrance opening in said rear wall and an exit opening in said lower oblique wall, and right and left side walls, one of said side walls having formed therein a shallow groove, said groove intersecting said rear wall and forming an intersecting ledge with said front wall, said ledge being adapted to severe a bonding wire laid in said groove and pulled taut against said ledge.

2. The tool of claim 1 wherein said groove is further defined as being generally straight.

3. The tool of claim 2 wherein the longitudinal axis of said groove is substantially parallel to the longitudinal axis of said guide hole.

4. The tool of claim 2 wherein said groove has a generally semi-circular cross-sectional shape.

5. The tool of claim 2 wherein the length of said groove is greater than the length of said guide hole.

6. The tool of claim 5 wherein the rear end of said groove intersects said enlarged entrance opening of said guide hole.

7. The tool of claim 6 wherein said enlarged entrance opening of said guide hole has a vertically elongated, ovoidal rear plan view shape.

8. The tool of claim 7 wherein said guide hole is further defined as having a funnel-shaped transition section joining the bore of said guide hole to said entrance opening.

9. The tool of claim 7 wherein said lower oblique wall of said tool is further defined as having formed therein a notch cut upwards, thereby forming in said lower oblique wall a notched instep section and rear heel section.

10. The tool of claim 9 wherein said exit opening of said guide hole is located forward of said instep region.

11. A method for semi-automatically threading bonding wire through a guide hole provided through an ultrasonic bonding tool comprising the steps of;
   a. making an end of a length of bonding wire coincident with a reference location on said tool,
   b. retracting said length of bonding wire with clamp means, to a Retracted position rearward of an entrance opening to said guide hole,
   c. recording in memory means the said Retracted position of said clamp means,
   d. advancing by means of said clamp means, the end of said wire into said entrance opening, said position being referred to as a Home position,
   e. recording in memory means said Home position, whereby a length of bonding wire may subsequently be semi-automatically threaded into said guide hole by pulling a length of bonding wire through said clamp means into a taut position with the end of said wire coincident with said reference location on said tool, actuating said clamp means to move said wire rearward to said Retracted position, and actuating said clamp means to move said wire forward to said Home position, thereby inserting said wire into said guide hole.

12. The method of claim 11 wherein said end of said length of bonding wire is made coincident with said reference location on said tool by severing a standing part of said bonding wire thereat.

13. The method of claim 12 wherein said bonding wire is severed at said reference location by a ledge provided thereat.

14. The method of claim 13 wherein said ledge is formed by the intersection of first wall of said tool with a groove formed in a second intersecting wall of said tool.

15. The method of claim 14 wherein said first wall of a said tool is further defined as a front wall thereof.

16. The method of claim 15 wherein said second wall of said tool is further defined as a side wall.

17. The method of claim 15 wherein said groove is further defined as being straight.

18. The method of claim 17 wherein said groove intersects said entrance opening of said guide hole in said rear wall of said tool.

* * * * *